US 6,580,184 B2

United States Patent
Song (10) Patent No.: US 6,580,184 B2
(45) Date of Patent: Jun. 17, 2003

(54) ELECTROSTATIC DISCHARGE (ESD) PROTECTION CIRCUIT OF SILICON-CONTROLLED RECTIFIER (SCR) STRUCTURE OPERABLE AT A LOW TRIGGER VOLTAGE

(75) Inventor: Ki-Whan Song, Seoul (KR)

(73) Assignee: Samsung Electronics Co., Ltd., Kyunggi-Do (KR)

( * ) Notice: Subject to any disclaimer, the term of this patent is extended or adjusted under 35 U.S.C. 154(b) by 0 days.

(21) Appl. No.: 10/146,046

(22) Filed: May 16, 2002

(65) Prior Publication Data

US 2003/0016479 A1 Jan. 23, 2003

(30) Foreign Application Priority Data

Jul. 21, 2001 (KR) ........................................ 2001-44052

(51) Int. Cl.[7] ............................................... H01L 29/74
(52) U.S. Cl. .................... 307/112; 257/355; 257/173; 257/362; 361/56
(58) Field of Search .......................... 307/112; 361/56, 361/88, 91, 93, 100, 111, 58; 257/172–174, 355–363; 438/133

(56) References Cited

U.S. PATENT DOCUMENTS

| 5,218,222 | A | * | 6/1993 | Roberts | ..................... 257/362 |
| 5,455,436 | A | * | 10/1995 | Cheng | |
| 5,465,189 | A | * | 11/1995 | Polgreen et al. | |
| 5,872,379 | A | * | 2/1999 | Lee | ............... 257/355 |
| 6,476,422 | B1 | * | 11/2002 | Yu | ............... 257/173 |

* cited by examiner

Primary Examiner—Brian Sircus
Assistant Examiner—Calixto Rodriguez
(74) Attorney, Agent, or Firm—Volentine Francos, PLLC (57) ABSTRACT

An ESD protection circuit having silicon-controlled rectifier structure, includes a PNP transistor and an NPN transistor. A switch circuit is connected between a ground voltage terminal and a well region that is a base of the PNP transistor. The switch circuit is formed of plural diode-coupled MOS transistors, so that a trigger voltage of the SCR is determined by threshold voltages of the MOS transistors.

19 Claims, 13 Drawing Sheets

ELECTROSTATIC DISCHARGE (ESD) PROTECTION CIRCUIT OF SILICON-CONTROLLED RECTIFIER (SCR) STRUCTURE OPERABLE AT A LOW TRIGGER VOLTAGE

The present application claims priority under 35 U.S.C. §119 to Korean Patent Application No. 2001-44052 filed on Jul. 21, 2001, which is hereby incorporated by reference in its entirety.

BACKGROUND OF THE INVENTION

1. Field of the Invention

The present invention relates to electrostatic discharge (ESD) protection units for integrated circuits and, more specifically, to ESD protection units made of silicon-controlled rectifiers (SCRs) operable in low power integrated circuits.

2. Description of the Art

Semiconductor integrated circuits fabricated by CMOS (complementary metal-oxide-semiconductor) techniques are very sensitive to an ESD, which may be caused by contact with a human body for example. These circuits are adversely affected by an excessively high incoming voltage (or current) from the ESD action. Such an ESD accompanied by an excessive high voltage (or current) causes thin isolation layers of the circuits to be damaged destructively, and/or channels thereof to be shorted, resulting in malfunctions or operational impossibility of integrated circuits. For the purpose of obviating the physical damage, ESD protection units are generally employed in integrated circuits. Such ESD protection units discharge a transient voltage which is excessively high to the outside of an integrated circuit, in order to prevent the transient voltage from being applied to internal circuits of an integrated circuit chip.

The ESD protection units are essential elements for securing stability of semiconductor products. In particular, semiconductor products operating at high frequency and having high integration density especially need high performance ESD protection units. In order to improve the efficiency of ESD protection units, the area provided in a semiconductor product for such an ESD protection unit generally must increase. However, this results in increases in parasitic capacitance. As a result, integration density of a semiconductor chip and current drivability of input/output circuits decrease.

Recently, silicon-controlled rectifiers (SCR) have been considered for protecting integrated circuits from ESD. In an SCR, positive feedback is provided by PNP and NPN bipolar transistors when ESD occurs, thus enhancing discharge capacity. Since hot carrier paths are prevented from concentrating at any local spot, heated-up areas are distributed over the area of the SCR. These features make an SCR very adaptable for protecting integrated circuits from ESD. Such a conventional ESD protection circuit having SCR structure is disclosed in U.S. Pat. No. 5,465,189.

An important functional characteristic of an ESD protection circuit having SCR structure relates to how fast it can be turned (or triggered) on at a desirable voltage. In U.S. Pat. No. 5,455,436, a punch-through voltage (or current) is used as a triggering stimulus, by means of an MOS transistor including source and drain regions which are not structured with an LDD (lightly-doped drain) architecture. In U.S. Pat. No. 5,872,379, a junction breakdown voltage is lowered by forming a low concentration P-type impurity region, overlapped with an N-type well, at a region adjacent to an N+ region in a P-type substrate. The junction breakdown voltage acts as a triggering voltage of the SCR.

While these conventional circuits use a junction breakdown voltage between an N+ region and a P-type substrate, or a punch-through voltage of an MOS transistor, these voltages are marginal factors having a preferred level with a minimum variation of voltage. Therefore, it is substantially difficult for junction breakdown voltage or punch-through voltage to precisely control a trigger voltage of an SCR. Thus, there is a need to control a trigger voltage to be lower and more precise.

Summary of the Invention

The present invention is therefore directed to an electrostatic discharge protection circuit having silicon controlled rectifier structure, which substantially overcomes one or more of the problems due to the limitations and disadvantages of the related art.

It is therefore an object of the present invention to provide an ESD protection unit having SCR structure with a trigger voltage that can be controlled precisely.

The above noted object is fulfilled by an ESD protection unit of the invention that is formed in a semiconductor substrate of first conductivity type, that protects a semiconductor integrated circuit connected to a first node, and that includes a low impurity region of a second conductivity type. A first high impurity region of the first conductivity type is formed in the low impurity region and connected to the first node. A second high impurity region of the second conductivity type is formed in the low impurity region and connected to the first node. A third high impurity region of the second conductivity type is spaced apart from the low impurity region and formed in the semiconductor substrate to be electrically connectable with a second node. A fourth high impurity region of the first conductivity type is formed in the semiconductor substrate and connected to the second node. A fifth high impurity region of the second conductivity type is formed in the low impurity region, and is interposed between the first high impurity region and the third high impurity region. A switch circuit, formed of diode-coupled NMOS transistors, provides a current path from the fifth high impurity region to the second node, when a voltage at the first node reaches a predetermined trigger voltage. A trigger voltage of the ESD protection circuit is dependent on threshold voltages of the NMOS transistors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

In the following description, specific numbers, materials and configurations are set forth merely for the purpose of explanation, in order to provide a thorough understanding of the present invention. However, it will be apparent to one skilled in the art that the present invention may be practiced without these particular specifics. In other instances, well-known systems are shown in diagrammatic or block diagram form, so as not to obscure the present invention.

Figure 1:
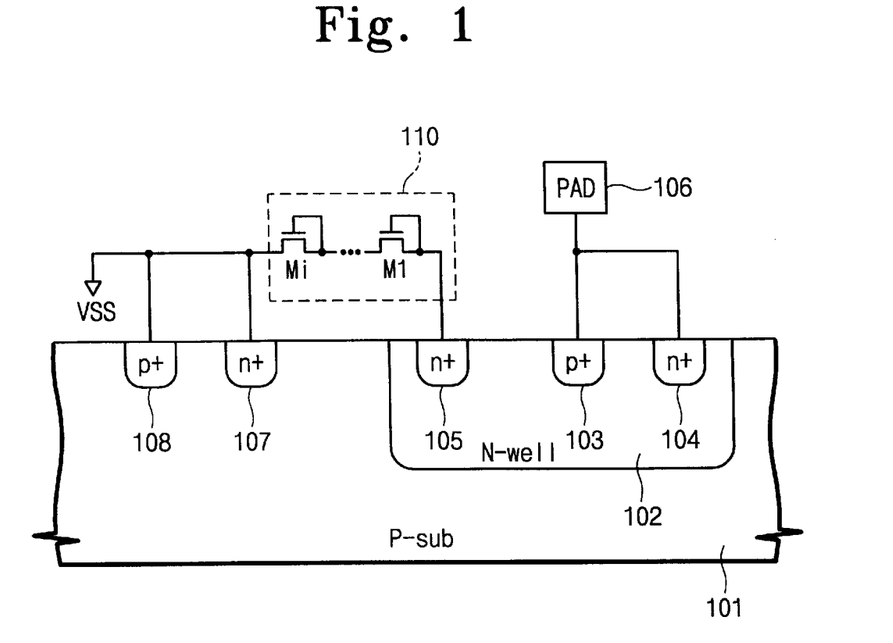
FIG. 1 is a sectional diagram of an ESD protection circuit of SCR structure according to an embodiment of the invention.

FIG. 1 shows an architecture of an SCR for ESD protection in accordance with an embodiment of the invention. Referring to FIG. 1, an ESD protection unit 100 has an N-type well region 102 formed in a P-type semiconductor substrate 101. The well region 102 contains a heavily doped P+ impurity region 103, and heavily doped N+ impurity regions 104 and 105. The P+ impurity region 103 is interposed between the N+ impurity regions 104 and 105. The impurity regions 103 and 104 are electrically connected to a pad 106. In addition, a heavily doped N+ impurity region 107 is formed in the substrate 101, being spaced apart from the well region 102. Also, a heavily doped P+ impurity region 108 is formed in the substrate 101, with the N+ impurity region 107 interposed between the well region 102 and heavily doped P+ impurity region 108. The N+ and P+ impurity regions 107 and 108 are electrically connected to a ground voltage terminal VSS.

Between the N+ impurity regions 105 and 107 (or the ground voltage terminal VSS) is connected a switch circuit 110 formed of diode-coupled NMOS transistors M1~Mi (i is 2 or an integer larger than 2). That is, one end of switch circuit 110 is connected to the N+ impurity region 105, and the other end of switch circuit 110 is connected to N+ impurity region 107 and ground voltage terminal VSS.

Figure 2:
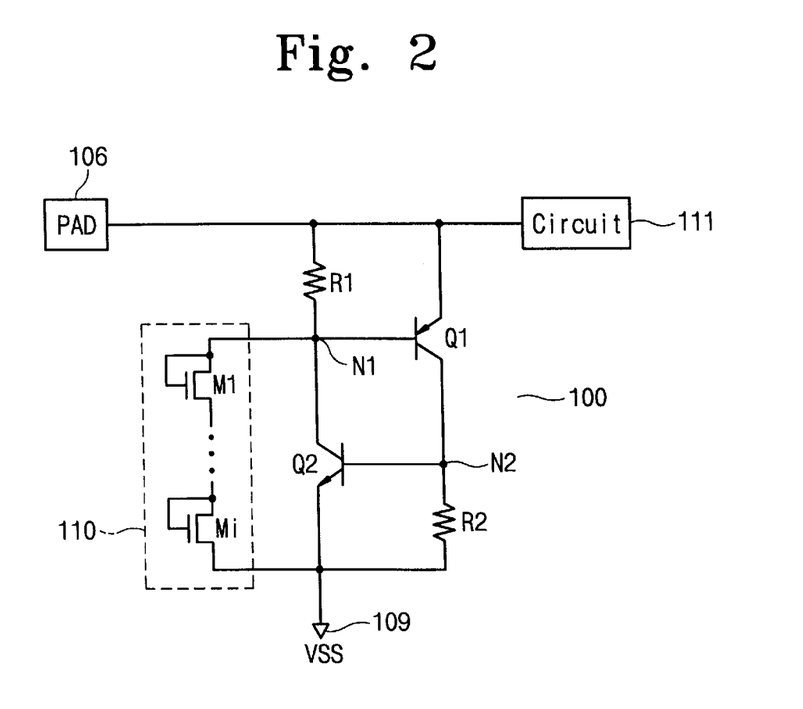
FIG. 2 is an equivalent diagram of the SCR shown in FIG. 1.

Referring to FIG. 2, which illustrates an equivalent circuit of the ESD protection unit (i.e., SCR) shown in FIG. 1, it can be seen that the equivalent circuit of the ESD protection unit is disposed between the pad 106 and an internal circuit 111 which needs to be protected from transients flowing in through the pad 106. The circuit 100 is composed of a PNP bipolar transistor Q1, an NPN bipolar transistor Q2, resistors R1 and R2, and the switch circuit 110. That is, an emitter of the PNP bipolar transistor Q1 is connected to the pad 106 and the internal circuit 111. A base of transistor Q1 is connected to a collector of transistor Q2, and a collector of transistor Q1 is connected to a base of transistor Q2. A node N1 between the base of transistor Q1 and the collector of transistor Q2 is connected to the pad 106 through the resistor R1. A node N2 between the base of transistor Q2 and the collector of transistor Q1 is connected to the ground voltage terminal VSS through the resistor R2. The switch circuit 110 is connected between the junction node N1 and the ground voltage terminal VSS. A turn-on voltage of the switch circuit 110, i.e., a trigger voltage of the SCR, is the sum of threshold voltages of the NMOS transistors M1~Mi connected in series between the junction node N1 and the ground voltage terminal VSS. The SCR circuit 100 of the ESD protection unit is conductive (or turned on) when a voltage between the pad and ground voltage terminal rises to be greater than the threshold voltage sum of the NMOS transistors M1~Mi.

In FIG. 2, R1 is resistance in the N-type well region 102 and R2 is resistance in the P-type semiconductor substrate 101. The P+ impurity region 103, the well region 102, and the substrate 101 correspond respectively to the emitter, the base, and the collector of transistor Q1. The N+ impurity region 107, the substrate 101, and the well region 102 correspond respectively to the emitter, the base, and the collector of transistor Q2.

Operation of the circuit will be described as follows with reference to FIGS. 1 and 2. When a large enough voltage to turn on the switch circuit 110 is applied between the pad 106 and the ground voltage terminal VSS, the P+ impurity region 103 and the N-type well region 102, i.e., a P+/N− junction, are forward-biased to form a current path between the well region 102 and the ground voltage terminal VSS. That is, a voltage drop occurs through the resistor R1 of the well region 102, so that an emitter-to-base junction of the PNP bipolar transistor Q1 becomes forward-biased. The PNP transistor Q1 is turned on. Holes at the pad 106 flow through to the ground voltage terminal VSS via the substrate 101, which acts as the collector of transistor Q1. At this time, a voltage drop through the resistor R2 causes the NPN bipolar transistor Q2 to be conductive. Electrons supplied from the ground voltage terminal VSS flow through to the pad 106 via the NPN bipolar transistor Q2 (along a path of the N+ impurity region 107, the substrate 101, the well region 102, and the N+ impurity region 104). As a result, a positive feedback loop is formed to accelerate a current flow for a discharge operation against transients.

A trigger voltage of the SCR is determined by a voltage that is large enough to turn on the diode-coupled NMOS transistors M1~Mi. Therefore, the trigger voltage depends on threshold voltages of the NMOS transistors in the switch circuit 110. Since the threshold voltage is an important parameter to be established very carefully, the trigger voltage of the SCR can thus be adjusted precisely. That is, a turn-on voltage of the switch circuit 110 proportionally depends on the number of serial-connected NMOS transistors. The smaller the number of the NMOS transistors, the lower the turn-on voltage of the switch circuit 110. Thus, it is possible to design the ESD protection unit of SCR structure to be operable responsive to a lower trigger voltage.

Various modifications for this above noted embodiment described with respect to FIG. 1 are shown in FIGS. 3 through 8 and described as follows. It is to be understood that the same reference numerals as used in FIGS. 1 and 2 are used throughout FIGS. 3 through 8 as appropriate, for simplicity.

Figure 3:
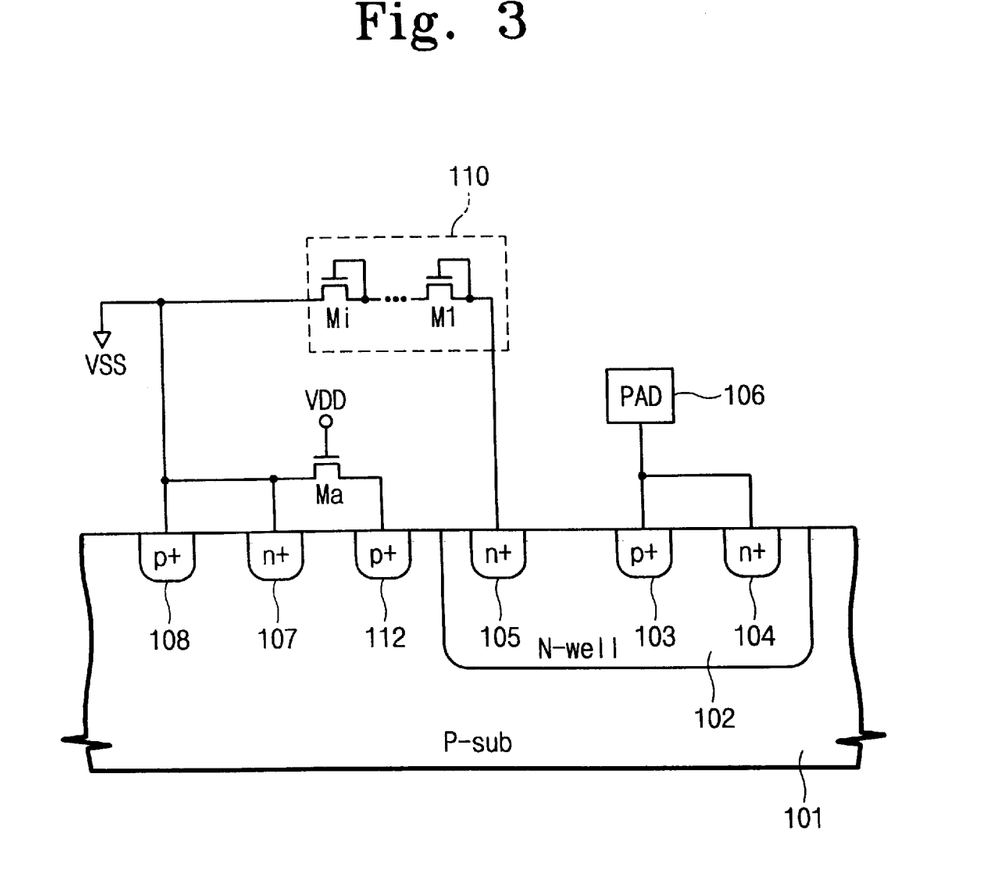
FIGS. 3 through 8 show various modifications of the SCR shown in FIG. 1.

Referring to FIG. 3, a heavily doped P+ high impurity region 112 is formed in the substrate 101, between the well region 102 and the N+ impurity region 107. An NMOS transistor Ma is coupled between the P+ impurity region 112 and the ground voltage terminal VSS. A gate of NMOS transistor Ma is connected to a power supply voltage terminal VDD. The structure shown in FIG. 3 is the same as that shown in FIG. 1, except for the above noted P+ impurity region 112 and the NMOS transistor Ma.

Figure 4:
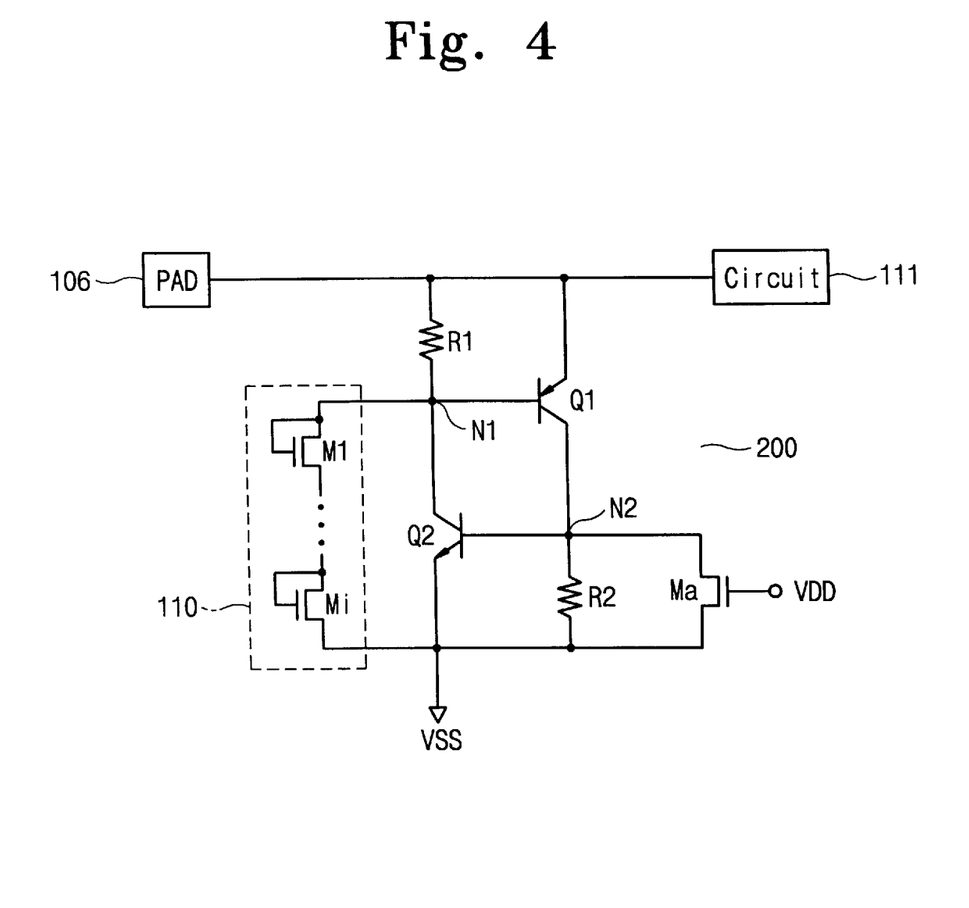

FIG. 4 illustrates an equivalent circuit of the ESD protection unit of SCR structure shown in FIG. 3. As shown, the circuit 200 includes NMOS transistor Ma connected between a gate of the NPN bipolar transistor Q2 and the ground voltage terminal VSS (or connected to the resistor R2 in parallel). In an alternative that is equivalent to the structure shown in FIG. 3, the structure of FIG. 5 includes the P+ impurity region 112 disposed at the opposite side of N-type well region 102. That is, in FIG. 5 well region 102 is interposed between the N+ impurity regions 107 and P+ impurity region 112.

Figure 5:
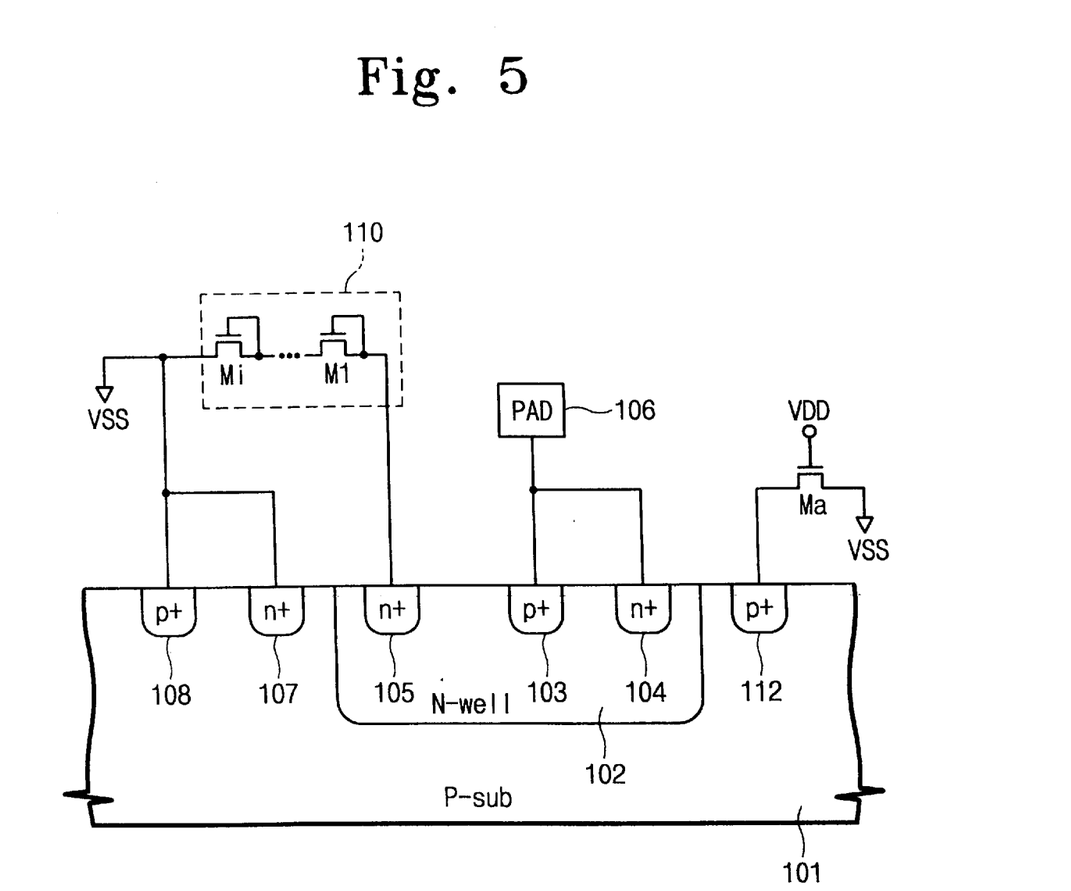

Such configurations of the SCR circuit as illustrated in FIGS. 3–5 enhances operational stability during a normal mode in which the power supply voltage VDD is applied to the pad 106. That is, in a normal operation mode, the SCR is completely turned off by connecting the P+ impurity region 112 to the ground voltage terminal VSS through the NMOS transistor Ma and applying VDD to the gate of the NMOS transistor Ma.

Figure 6:
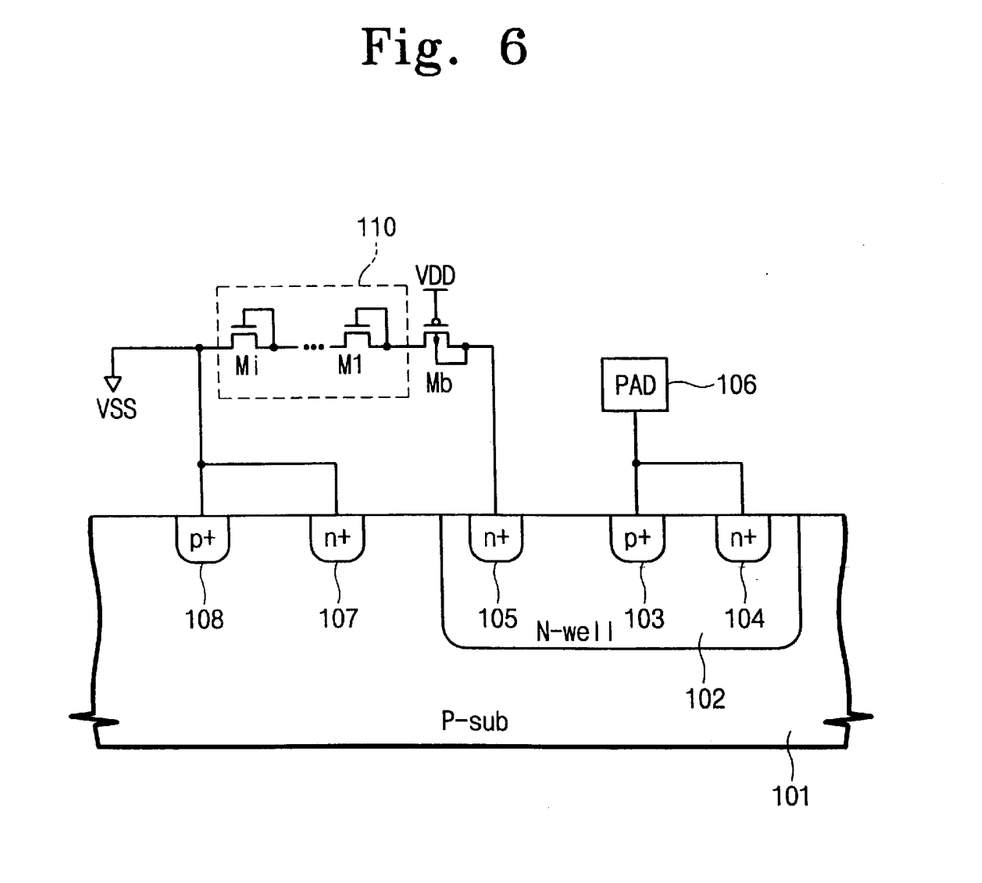
Figure 7:
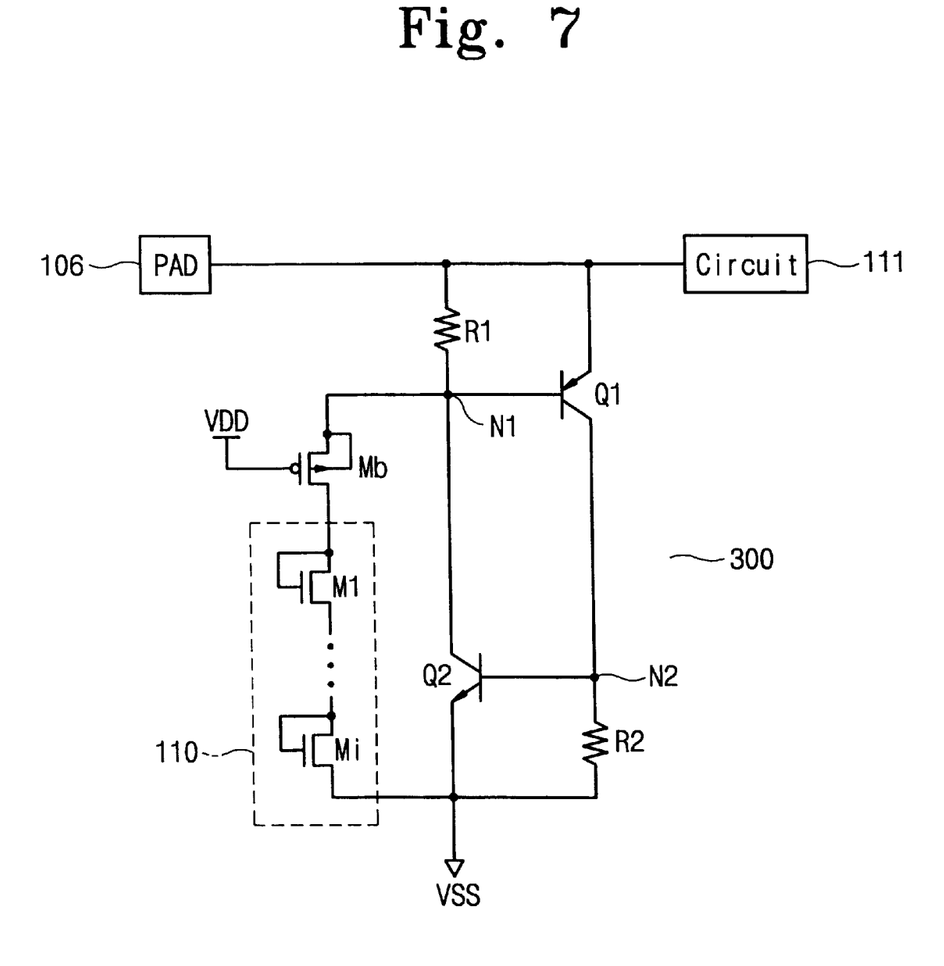

FIG. 6 shows a structure of an ESD protection unit of a further embodiment, whereby a sub-threshold current that would be generated between the pad 106 and the ground voltage terminal VSS in a normal operation mode is cut off. Referring to FIG. 6, the ESD protection unit is the same as that shown in FIG. 1, except for also including a PMOS transistor Mb connected between the first NMOS transistor M1 of the switch circuit 110 and the N+ impurity region 105 of the well region 102. A gate of the PMOS transistor Mb is coupled to the power supply voltage terminal VDD. Alternatively, the PMOS transistor Mb can be disposed at a position in the diode-coupled chain of the NMOS transistors M1~Mi, or connected between the last NMOS transistor Mi and the ground voltage terminal VSS. The unit shown in FIG. 6 operates in the same manner as that shown in FIG. 1, except that the PMOS transistor Mb cuts off the sub-threshold current during a normal operation mode. FIG. 7 shows an electrically equivalent circuit of the ESD protection unit of FIG. 6, as including circuit 300 having PMOS transistor Mb coupled between switch circuit 110 and node N1.

Figure 8:
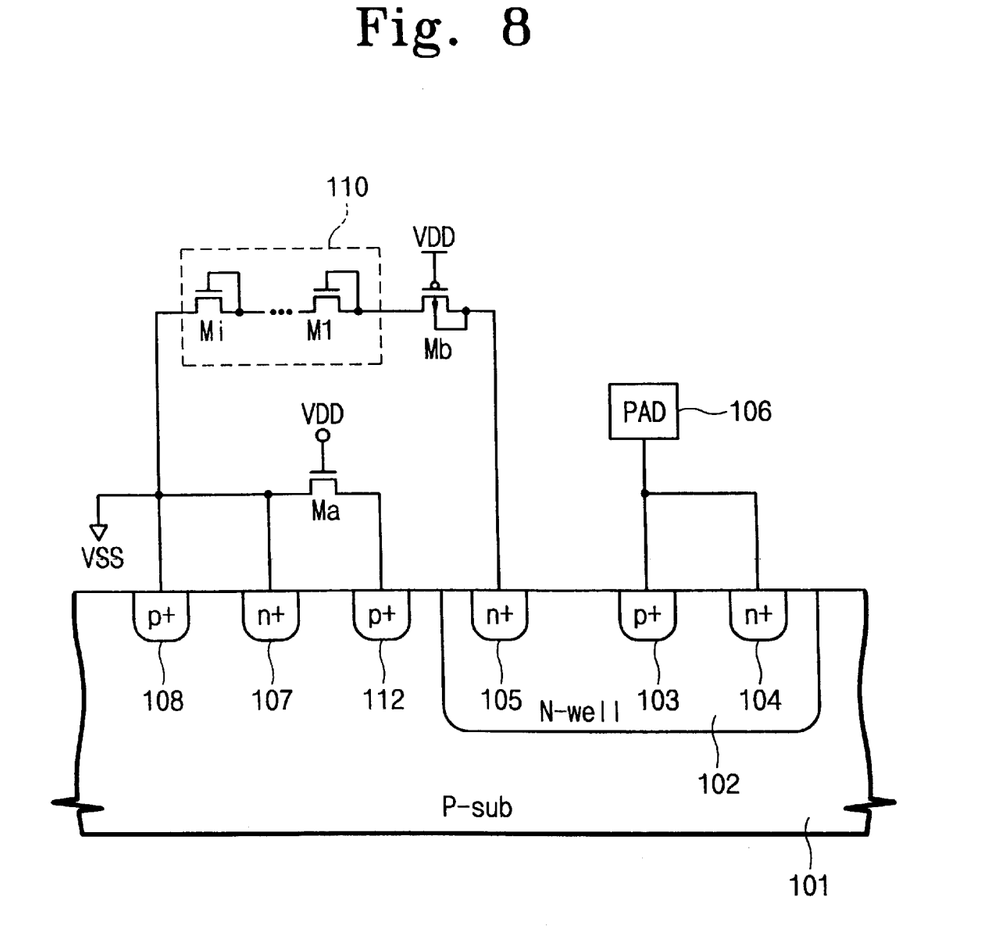

FIG. 8 illustrates an ESD protection unit of SCR structure of a further embodiment, which combines the features of the NMOS transistor Ma of FIG. 3 and the PMOS transistor Mb of FIG. 6. The ESD protection unit of this embodiment secures both a stable turn-off function and a reliable cut-off for the sub-threshold current.

Figure 9:
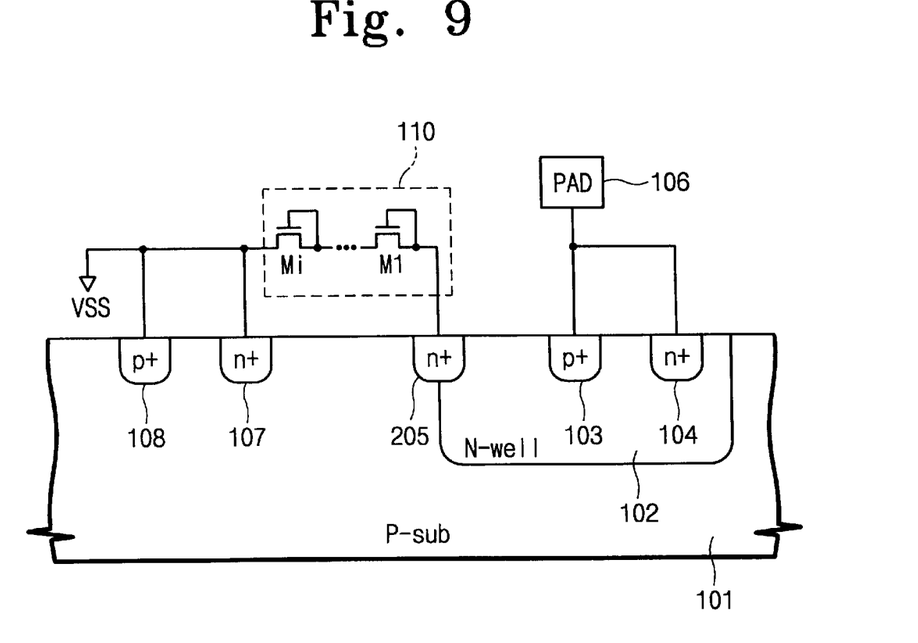
FIG. 9 is a sectional diagram of an ESD protection circuit of SCR structure according to another embodiment of the invention.
Figure 10:
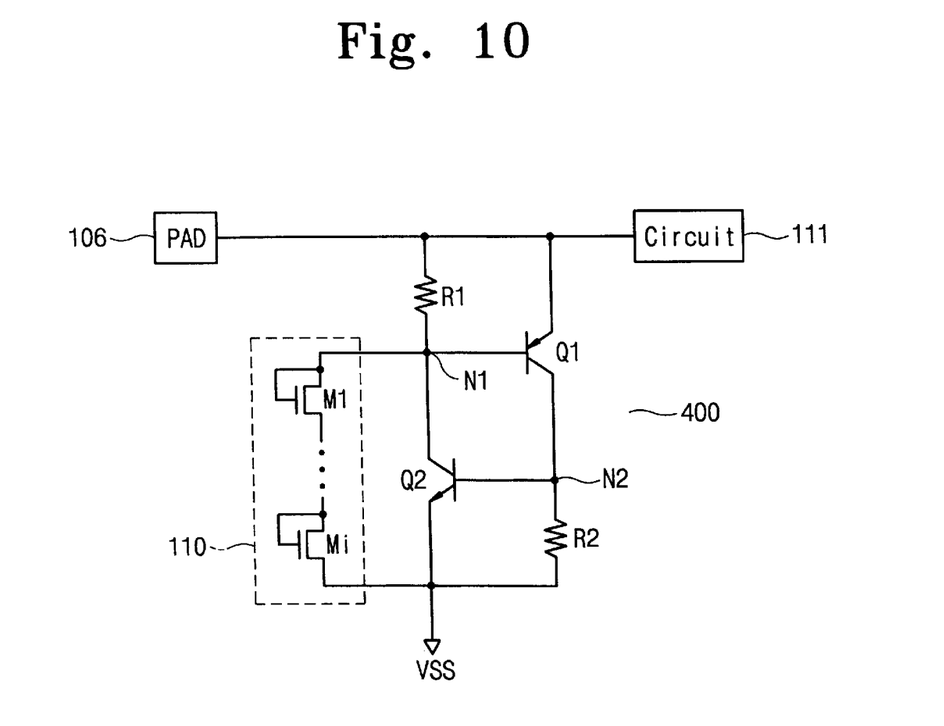
FIG. 10 is an equivalent diagram of the SCR shown in FIG. 9.

In another embodiment of an ESD protection unit as shown in FIG. 9, a heavily doped N+ impurity region 205 is formed at a boundary junction between the substrate 101 and the well region 102. This structure is the same as the structure shown in FIG. 1, except for that N+ impurity region 205 is provided in FIG. 9 instead of N+ impurity region 105 of FIG. 1. That is, similar to the structure of FIG. 1, the ESD protection unit of FIG. 9 includes the P+ and N+ impurity regions 108 and 107 formed in the substrate 101, and the P+ and N+ impurity regions 103 and 104 formed in the well region 102. The P+ and N+ impurity regions 103 and 104 are electrically connected to the pad 106, while the P+ and N+ impurity regions 108 and 107 are connected to VSS. The switch circuit 110 is connected between the N+ impurity region 205 and VSS. The equivalent circuit of the structure of FIG. 9 as shown in FIG. 10, is the same as the equivalent circuit shown in FIG. 2, whereby circuit 100 and circuit 400 are the same. The N+ impurity region 205 positioned at the boundary junction between the substrate 101 and the well region 102 contributes to reducing a junction breakdown voltage therebetween, which is advantageous in accomplishing a lower trigger voltage of SCR.

FIGS. 11 to 14 show modifications of the structure shown in FIG. 9, and variously further include the NMOS transistor Ma for conducting a stable turn-off function and the PMOS transistor Mb for cutting off a sub-threshold current. These modifications of the structure of FIG. 9 are respectively similar to the modifications of the structure of FIG. 1 as shown and described with respect to FIGS. 3, 5, 6, and 8.

Figure 11:
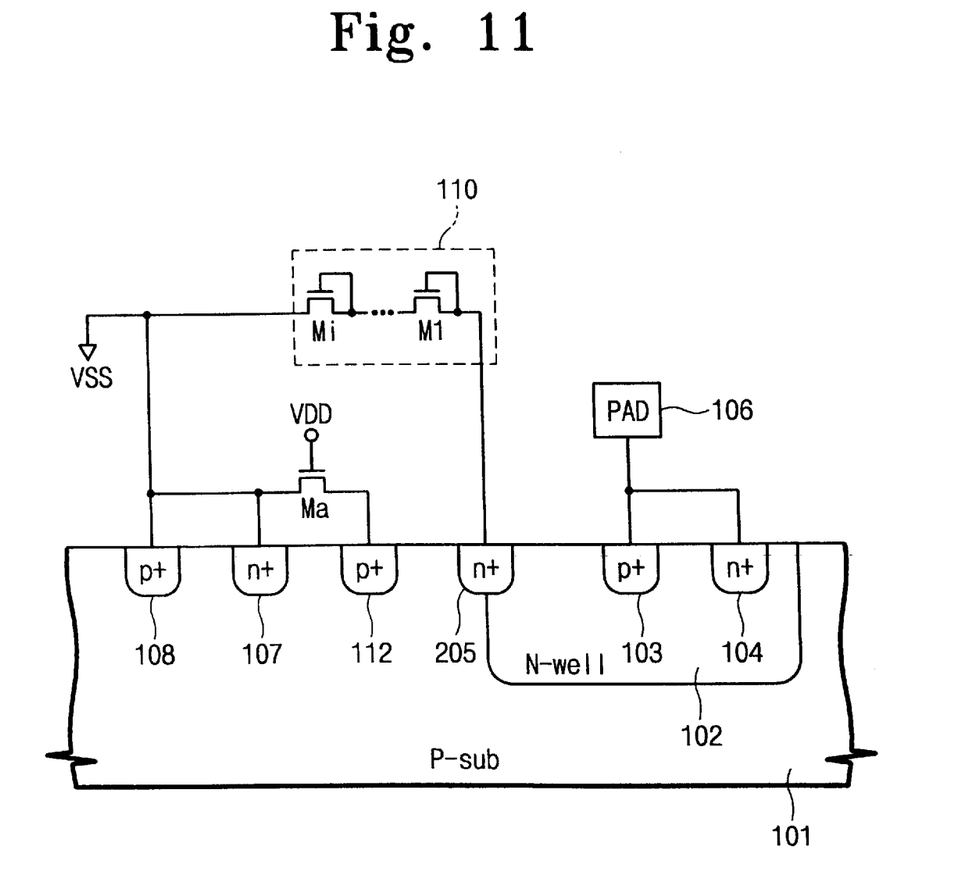
FIGS. 11 through 14 show various modifications of the SCR shown in FIG. 9.
Figure 12:
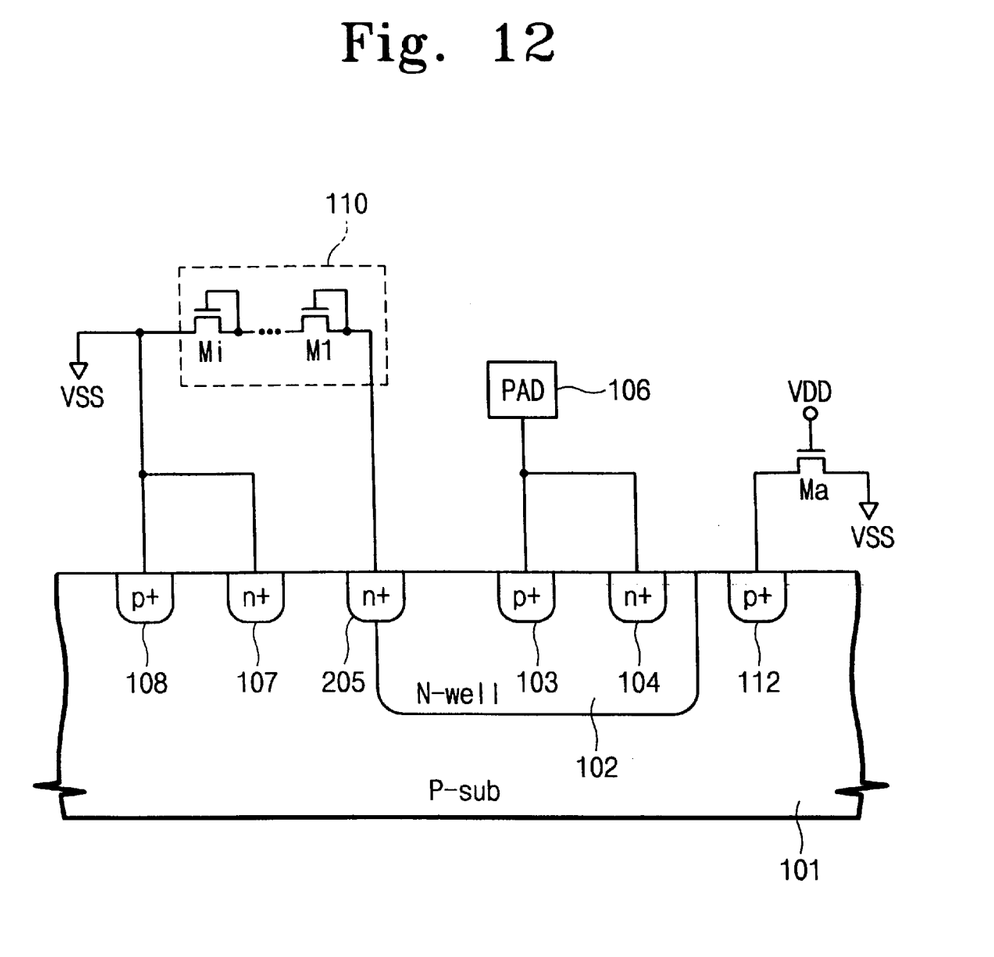
Figure 13:
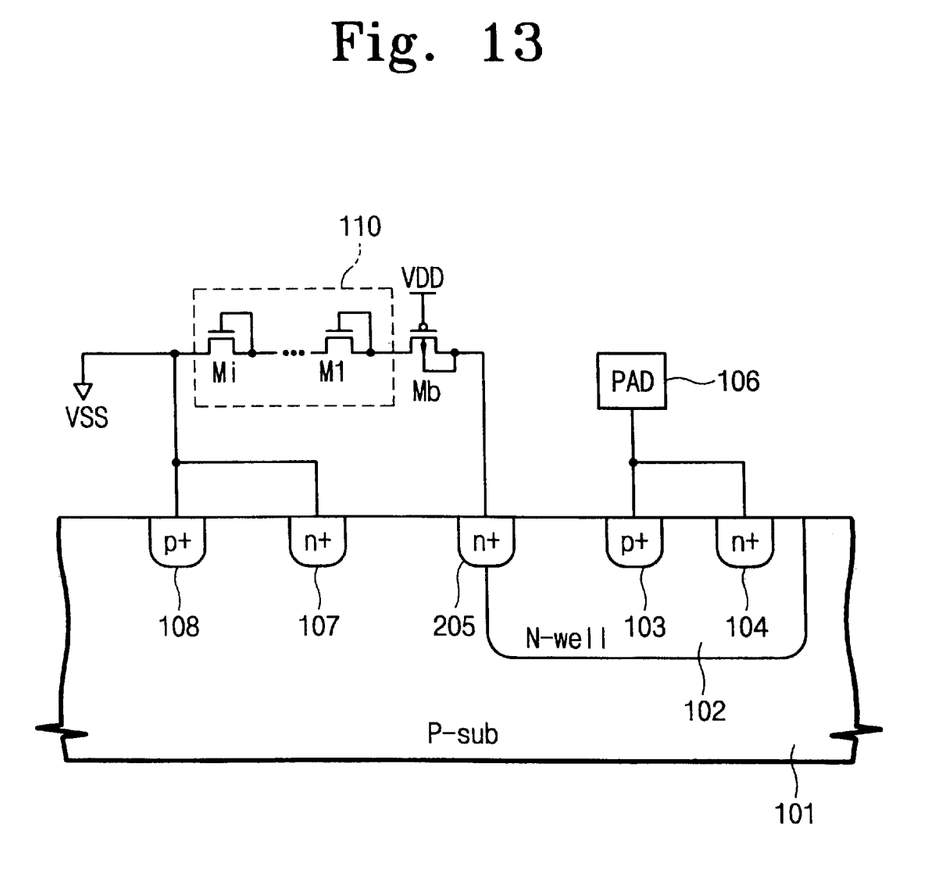
Figure 14:
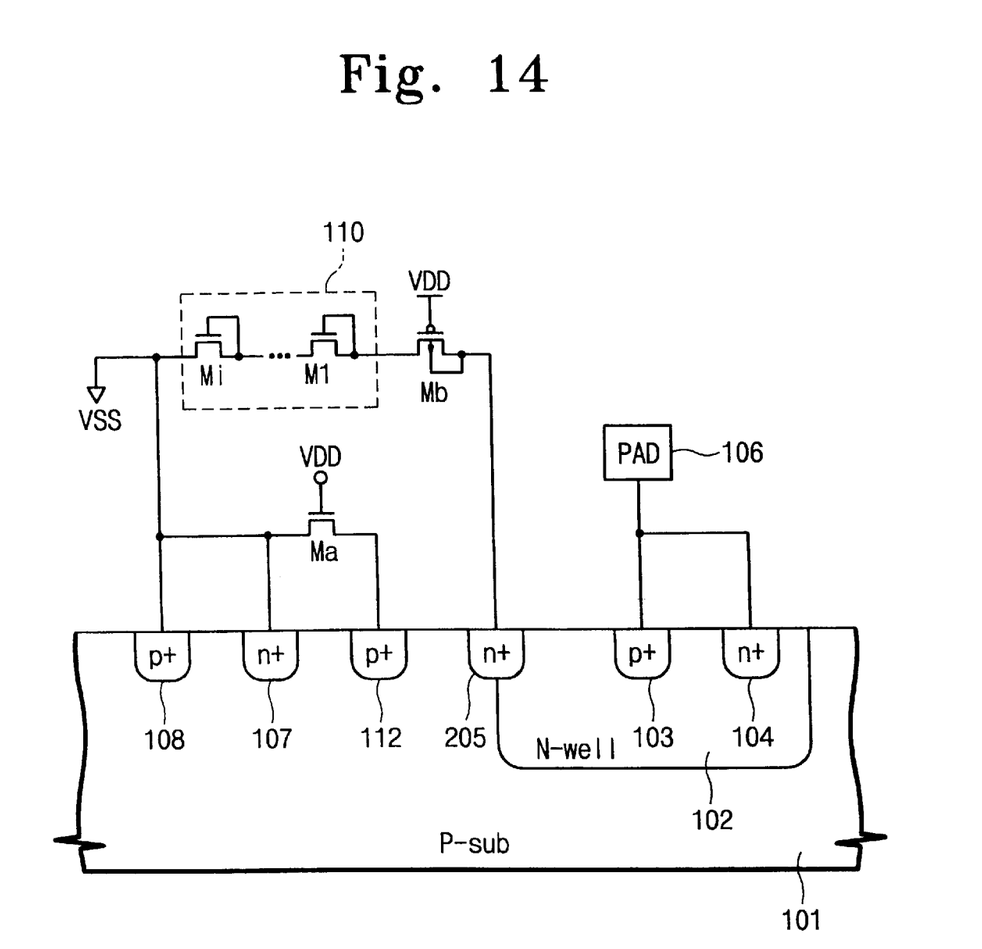

That is, in FIG. 11 the NMOS transistor Ma is connected between the P+ impurity region 112 and VSS, as somewhat similar to the structure shown in FIG. 3. In FIG. 12, the NMOS transistor Ma is connected between VSS and the P+ impurity region 112 that is formed at an opposite side of well region 102 than that in FIG. 11, as somewhat similar to the structure shown in FIG. 5. In FIG. 13, the PMOS transistor Mb is connected between the N+ impurity region 205 and the switch circuit 110 as somewhat similar to the structure shown in FIG. 6. The PMOS transistor Mb can also be inserted in the diode-coupled chain of the NMOS transistors M1~Mi in FIG. 13 as an alternative, or connected between the last NMOS transistor Mi and VSS. The structure of the ESD protection shown in FIG. 14 includes a combination of both NMOS transistor Ma and PMOS transistor Mb of FIGS. 11 and 13, as somewhat similar to the structure shown in FIG. 8.

Figure 15:
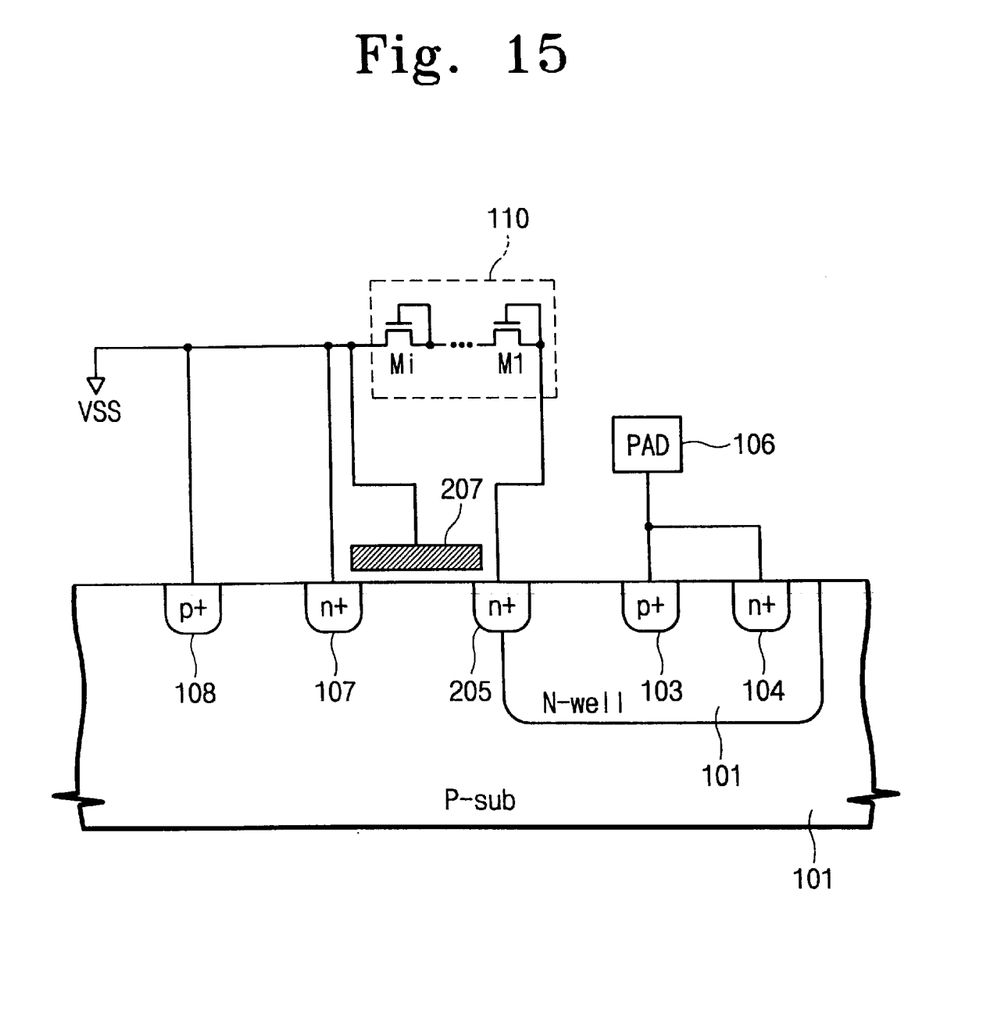
FIG. 15 is a sectional diagram of an ESD protection circuit of SCR structure according to a further embodiment, with narrowed base width.

Another important aspect that would enhance operation efficiency of an SCR is the ability to adjust a base width of the NPN bipolar transistor Q2 (shown in FIG. 2 for example). The base width of the NPN transistor in FIG. 15 is defined as a width of a P-type region (substrate 101) between the N+ impurity region 107 connected to VSS and the N+ impurity region 205. As shown in FIG. 15, the base width can be effectively made more narrow by means of a gate polysilicon layer 207 formed over a substrate surface between the N+ impurity regions 107 and 205. The gate polysilicon layer 207 is electrically connected to VSS.

As described above, the invention provides advanced techniques to adjust a trigger voltage of a SCR for an ESD protection unit. As the trigger voltage can be precisely controlled by trimming threshold voltages of the switch circuit, the ESD protection unit is readily adaptable for use with low-power semiconductor integrated circuit devices.

Although the preferred embodiments of the present invention have been disclosed for illustrative purposes, those skilled in the art will appreciate that various modifications, additions and substitutions are possible, without departing from the scope and spirit of the invention as described in the accompanying claims. As aforementioned, the number of the diode-coupled NMOS transistors may be variable in accordance with a design rule relevant to a trigger voltage of SCR. In addition, those skilled in this art may replace the NMOS transistors with other circuit elements, which similarly perform the operation to adjust a level of the trigger voltage.

What is claimed is:

1. A protection unit for a semiconductor integrated circuit connected to a first terminal, the protection unit comprising:
   a low impurity region formed in a semiconductor substrate of a first conductivity type, the low impurity region having a second conductivity type;
   a first high impurity region of the first conductivity type formed in the low impurity region and connected to the first terminal;
   a second high impurity region of the second conductivity type formed in the low impurity region and connected to the first terminal;
   a third high impurity region of the second conductivity type formed in the semiconductor substrate and connected to a second terminal;
   a fourth high impurity region of the first conductivity type formed in the semiconductor substrate and connected to the second terminal;

a fifth high impurity region of the second conductivity type formed in the low impurity region; and a switch circuit connected between the fifth high impurity region and the second terminal, the switch circuit providing a current path when a voltage at the first terminal exceeds a threshold voltage of the switch circuit.

2. The protection unit of claim 1, further comprising:

a sixth high impurity region of the first conductivity type formed in the substrate; and an NMOS transistor connected between the sixth high impurity region and the second terminal, a gate of the NMOS transistor being coupled to a power supply voltage terminal.

3. The protection unit of claim 2, further comprising a PMOS transistor connected in series with the switch circuit between the fifth high impurity region and the second terminal, a gate of the PMOS transistor being coupled to the power supply voltage terminal.

4. The protection unit of claim 3, wherein the switch circuit is constructed of diode-coupled NMOS transistors connected in series between the fifth high impurity region and the second node.

5. The protection unit of claim 4, wherein threshold voltages of the diode-coupled NMOS transistors determine the threshold voltage of the switch circuit, which is a trigger voltage of the protection unit.

6. The protection unit of claim 2, wherein the switch circuit is constructed of diode-coupled NMOS transistors connected in series between the fifth high impurity region and the second node.

7. The protection unit of claim 6, wherein threshold voltages of the diode-coupled NMOS transistors determine the threshold voltage of the switch circuit, which is a trigger voltage of the protection unit.

8. The protection unit of claim 1, wherein the fifth high impurity region is formed at a junction between the low impurity region and the substrate.

9. The protection unit of claim 8, further comprising:

a sixth high impurity region of the first conductivity type formed in the substrate; and an NMOS transistor connected between the sixth high impurity region and the second terminal, a gate of the NMOS transistor being coupled to a power supply voltage terminal.

10. The protection unit of claim 9, further comprising a PMOS transistor connected in series with the switch circuit between the fifth high impurity region and the second node, a gate of the PMOS transistor being coupled to the power supply voltage terminal.

11. The protection unit of claim 8, wherein the switch circuit is constructed of diode-coupled NMOS transistors connected in series between the fifth high impurity region and the second node.

12. The protection unit of claim 11, wherein threshold voltages of the diode-coupled NMOS transistors determine the threshold voltage of the switch circuit, which is a trigger voltage of the protection unit.

13. The protection unit of claim 8, further comprising a PMOS transistor connected in series with the switch circuit between the fifth high impurity region and the second terminal, a gate of the PMOS transistor being coupled to a power supply voltage terminal.

14. The protection unit of claim 8, further comprising a conductive layer formed over a surface of the substrate between the third and fifth high impurity regions, the conductive layer being connected to the second terminal.

15. The protection unit of claim 1, further comprising a PMOS transistor connected in series with the switch circuit between the fifth high impurity region and the second terminal, a gate of the PMOS transistor being coupled to a power supply voltage terminal.

16. The protection unit of claim 15, wherein the switch circuit is constructed of diode-coupled NMOS transistors connected in series between the fifth high impurity region and the second node.

17. The protection unit of claim 16, wherein threshold voltages of the diode-coupled NMOS transistors determine the threshold voltage of the switch circuit, which is a trigger voltage of the protection unit.

18. The protection unit of claim 1, wherein the switch circuit is constructed of diode-coupled NMOS transistors connected in series between the fifth high impurity region and the second node.

19. The protection unit of claim 18, wherein threshold voltages of the diode-coupled NMOS transistors determine the threshold voltage of the switch circuit, which is a trigger voltage of the protection unit.

* * * * *